(12) United States Patent
Richter et al.

(10) Patent No.: US 12,044,722 B2
(45) Date of Patent: Jul. 23, 2024

(54) SEMICONDUCTOR COMPONENT, SYSTEM AND METHOD FOR CHECKING A SOLDERED JOINT

(71) Applicant: OSRAM Opto Semiconductors GmbH, Regensburg (DE)

(72) Inventors: Jens Richter, Hemau (DE); Christopher Söll, Zirndorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 320 days.

(21) Appl. No.: 17/612,895

(22) PCT Filed: May 7, 2020

(86) PCT No.: PCT/EP2020/062679
§ 371 (c)(1),
(2) Date: Nov. 19, 2021

(87) PCT Pub. No.: WO2020/233993
PCT Pub. Date: Nov. 26, 2020

(65) Prior Publication Data
US 2022/0244306 A1    Aug. 4, 2022

(30) Foreign Application Priority Data
May 20, 2019  (DE) .......................... 102019113293.2

(51) Int. Cl.
*G01R 31/28*  (2006.01)
*H01L 33/62*  (2010.01)
*G01R 33/028*  (2006.01)

(52) U.S. Cl.
CPC .......... *G01R 31/2853* (2013.01); *H01L 33/62* (2013.01); *G01R 33/028* (2013.01); *H01L 2933/0066* (2013.01)

(58) Field of Classification Search
CPC ................ G01R 31/28; G01R 31/2851; G01R 31/2853; H01L 22/10; H01L 22/14; H01L 22/30; H01L 22/34; H01L 24/01; H01L 24/02; H01L 24/04–09; H01L 33/48; H01L 33/62
See application file for complete search history.

(56) References Cited

U.S. PATENT DOCUMENTS 5,787,098 A     7/1998  DasGupta et al.
2002/0125043 A1  9/2002  Yoshida
(Continued)

FOREIGN PATENT DOCUMENTS

WO    2009144608 A1     12/2009
WO    WO-2009144608 A1 *  12/2009   ........... G01R 31/048

*Primary Examiner* — Huy Q Phan
*Assistant Examiner* — David B Frederiksen
(74) *Attorney, Agent, or Firm* — Slater Matsil, LLP (57) ABSTRACT

In an embodiment a semiconductor component includes a laterally extending contact area laterally interrupted in such a way that material of the contact area laterally delimits at least one recess, the contact area configured to be at a potential, wherein at least one first recess is formed laterally as a circular ring around a lateral center point of the contact area, and wherein at least one second recess extends laterally in a straight line through the lateral center point of the contact area so that the contact area is divided by a corresponding recess into two halves which are not connected by material of the contact area.

17 Claims, 5 Drawing Sheets

(56) References Cited

U.S. PATENT DOCUMENTS

| | | | |
|---|---|---|---|
| 2006/0278984 A1 | 12/2006 | Yamada | |
| 2007/0018338 A1* | 1/2007 | Hosseini | H01L 24/78 257/784 |
| 2007/0152692 A1 | 7/2007 | Kinsley | |
| 2008/0258297 A1* | 10/2008 | Yip | H01L 24/05 257/737 |
| 2011/0140730 A1 | 6/2011 | Zieren et al. | |
| 2011/0169169 A1* | 7/2011 | Reinmuth | H01L 23/481 257/E21.59 |
| 2011/0204357 A1* | 8/2011 | Izuha | H01L 22/32 438/18 |
| 2011/0241201 A1 | 10/2011 | Wang et al. | |
| 2013/0124118 A1 | 5/2013 | Monda et al. | |
| 2014/0225274 A1* | 8/2014 | Guyenot | H01L 24/70 257/774 |
| 2016/0056118 A1 | 2/2016 | Yoon et al. | |
| 2016/0365497 A1* | 12/2016 | Kim | H01L 24/06 |
| 2018/0043450 A1* | 2/2018 | Kinsley | H05K 1/111 |

\* cited by examiner

SEMICONDUCTOR COMPONENT, SYSTEM AND METHOD FOR CHECKING A SOLDERED JOINT

This patent application is a national phase filing under section 371 of PCT/EP2020/062679, filed May 7, 2020, which claims the priority of German patent application 102019113293.2, filed May 20, 2019, each of which is incorporated herein by reference in its entirety.

TECHNICAL FIELD

A semiconductor component, a system comprising a carrier for contacting the semiconductor component, and a method for checking a soldered joint between the carrier and the semiconductor component are disclosed.

BACKGROUND

Verifying a solder connection between a semiconductor component and a carrier such as an IC (integrated circuit), on which the semiconductor component is mounted for contacting, is a challenge in terms of time and wiring effort as well as reliability.

SUMMARY

Embodiments provide a semiconductor component, a system comprising a carrier for contacting the semiconductor component, and a method for checking a soldered joint between the carrier and the semiconductor component, which method enables reliable inspection of the soldered joint and at the same time helps to keep a time and wiring effort required for this purpose low.

According to a first embodiment of the invention, a semiconductor component is disclosed. In particular, the semiconductor component is a light emitting diode (LED). The semiconductor component may be in a single form or may be part of a semiconductor compound. For example, the semiconductor component may comprise an LED chip which is arranged with further LED chips in a compound as a so-called diode array and is formed, for example, on a common wafer. The features described below on the basis of the semiconductor component can also be transferred to the other semiconductor components of the compound.

In at least one embodiment, the semiconductor component comprises a laterally extending contact area. A laterally extending contact area refers herein and hereinafter to an extension of an object in both a first direction and a second direction oblique to the first direction, the first and second directions spanning a plane. For example, the spanned plane is parallel to a main extension plane of the semiconductor component. The contact area may form at least a portion of the bottom surface of the semiconductor component. In the case that the semiconductor component is formed as an LED, the contact area is arranged in particular on a side of the LED facing away from the main radiation direction. Irrespective of the lateral extension, the contact area moreover has an extension in a third direction which is oblique to the spanned plane and defines a thickness of the contact area. The contact area is in particular electrically conductive. The contact area is referred to here in particular as a metallization which is provided for contacting an epitaxy of the semiconductor component.

In at least one embodiment, the contact area is laterally interrupted such that material of the contact area laterally bounds at least one recess. A lateral interruption is understood here and hereinafter to mean a complete interruption of an object in the third direction. Exemplarily, for this purpose the contact area may first be completely applied to the semiconductor component and subsequently removed in places, exemplarily by etching or slitting, in order to form the at least one recess. Alternatively, the recess may be formed in the course of forming the contact area, for example by masking.

In at least one embodiment, the contact area is at a potential during intended operation of the semiconductor component. In particular, the contact area forms a contact for operating the semiconductor component. In the case of an LED, the contact area may be, for example, an anode contact or a cathode contact.

In at least one embodiment, a semiconductor component is provided having a laterally extending contact area which is laterally interrupted in such a way that material of the contact area laterally bounds at least one recess, the contact area being at a potential in the intended operation of the semiconductor component. The semiconductor component is provided in particular for arrangement on a carrier and for electrical and mechanical connection to a carrier by a soldering process. In addition to the contact area, the semiconductor component has in particular a second contact which is formed and arranged separately from the contact area, exemplarily for contacting by a wire on an upper side of the semiconductor component or separately from the contact area likewise on the lower side of the semiconductor component. In the case of a semiconductor array, the second contact may in particular be a common contact, exemplarily a cathode contact of a diode array. Due to the interruption of the contact area, a distribution of eddy currents induced in the contact area by an alternating magnetic field when the semiconductor component soldered on the carrier is suitably excited may be influenced and, in particular, demonstrably disturbed. If the soldered joint with which the semiconductor component is connected to the carrier is sufficiently formed, that is to say in particular if the contact area and all the recesses are covered substantially over the entire area by solder material, a substantially undisturbed distribution of the eddy currents in the contact area and the solder material can be achieved, which can be verified in comparison with a disturbed distribution of the eddy currents if the soldered joint is insufficiently formed, that is to say in particular if the contact area is only partially covered by the solder material. In other words, by suitable formation of the soldered joint, an impairment of the eddy current distribution in the contact area caused by the recess can be eliminated, so that a full-surface wetting of the contact area with solder material can be clearly distinguished from an only partial wetting. In particular, a reliable evaluation of the wetting of the contact area can thus be carried out, for example, within the scope of a wafer test, without additional wiring and comparatively little time expenditure. In the case of a semiconductor compound, the costs incurred for checking the individual soldered joints can be kept low, so that in particular all soldered joints can be checked. This enables continuous process control in the assembly of the semiconductor component, which in turn contributes to the stability of the manufacturing process.

In at least one embodiment, at least one recess is laterally formed as a circular ring, circular ring portion, or circle around a lateral center point of the contact area.

In at least one embodiment, at least one recess extends laterally in a straight line through the lateral center point of the contact area, such that the contact area is divided by the corresponding recess into two halves that are not connected by material of the contact area.

In at least one embodiment, a plurality of recesses is provided. For example, at least one recess is laterally formed as a circular ring, circular ring portion or circle around a lateral center point of the contact area as well as at least one further recess extends laterally in a straight line through the lateral center point of the contact area, such that the contact area is divided by the corresponding recess into two halves that are not connected by material of the contact area.

According to a second embodiment of the invention, a system comprising a carrier for contacting a semiconductor component and a semiconductor component are disclosed. The carrier is in particular an IC. In the case of a semiconductor compound, the carrier may in particular be arranged for contacting all semiconductor components of the compound.

In at least one embodiment, the carrier comprises a laterally extending connection region. Here, a connection region is a contact of the carrier that is provided for separately contacting the contact area of the semiconductor component. In the case of a semiconductor compound, the carrier may have a respective connection region for separately contacting all semiconductor components of the compound. For example, the individual anode contacts of a diode array can each be individually controlled with a separate connection region of the carrier.

In at least one embodiment, the contact area is at least locally covered by a solder material for electrically bridging the at least one recess by the solder material. Preferably, the solder material is applied such that all of the recesses are electrically bridged or galvanically connected. In particular, it is provided that the solder material covers substantially the entire surface of the contact area and all recesses in order to achieve a uniform current distribution in the semiconductor component. In the course of manufacturing, however, it may occur that the solder material provided for bridging the recess is only partially applied and the soldered joint is to be classified as insufficient.

In at least one embodiment, the semiconductor component is arranged on the carrier such that the contact area faces the connection region and is connected to the connection region by the solder material.

In at least one embodiment, a system comprising a carrier for contacting a semiconductor component and a semiconductor component is disclosed, wherein the carrier has a laterally extending connection region. The contact area is at least locally covered by a solder material for electrically bridging the at least one recess through the solder material. The semiconductor component is disposed on the carrier such that the contact area faces the connection region and is connected to the connection region by the solder material.

According to a third embodiment of the invention, a system comprising a carrier for contacting a semiconductor component and a semiconductor component are disclosed. The semiconductor component is in particular an LED. The semiconductor component may be present in particular in a singular form or may be part of a semiconductor compound. The features described below on the basis of the semiconductor component can also be transferred to the other semiconductor components of the compound. The carrier is in particular an IC. In the case of a semiconductor network, the carrier can be set up in particular for contacting all the semiconductor components of the network.

In at least one embodiment, the carrier comprises a laterally extending contact area. Here, contact area refers to a contact of the carrier that is provided for separately contacting a connection region of the semiconductor component. In the case of a semiconductor compound, the carrier may comprise a respective contact area for separately contacting all semiconductor components of the compound.

In at least one embodiment, the contact area is laterally interrupted such that material of the contact area laterally defines at least one recess. Exemplarily, for this purpose, the contact area may first be completely applied to the carrier and subsequently removed in places, exemplarily by etching or slitting, in order to form the at least one recess. Alternatively, the recess may be formed in the course of forming the contact area, for example by masking.

In at least one embodiment, the contact area is at least locally covered by a solder material for electrically bridging the at least one recess by the solder material. Preferably, the solder material is applied such that all of the recesses are electrically bridged or galvanically connected. In particular, it is provided that the solder material covers substantially the entire surface of the contact area and all recesses in order to achieve a uniform current distribution in the semiconductor component. In the course of manufacturing, however, it may occur that the solder material provided for bridging the recess is only partially applied and the soldered joint is to be classified as insufficient.

In at least one embodiment, the semiconductor component comprises a connection region and is arranged on the carrier such that the connection region faces the contact area and is connected to the contact area by the solder material. In particular, the connection region is electrically conductive. The connection region is referred to herein in particular as a metallization which is provided for contacting an epitaxy of the semiconductor component. The connection region may in particular form an underside or a part of the underside of the semiconductor component. In the case that the semiconductor component is formed as an LED, the connection region is arranged in particular on a side of the LED facing away from the main radiation direction. The semiconductor component is electrically and mechanically connected to the carrier, in particular by the solder material. In addition to the connection region, the semiconductor component has in particular a second connection which is formed and arranged separately from the connection region, exemplarily for contacting by a wire on an upper side of the semiconductor component or separately from the connection region likewise on the lower side of the semiconductor component. In the case of a semiconductor compound, the second terminal can in particular be a common contact, for example a cathode contact of a diode array.

In at least one embodiment, a system comprising a carrier for contacting a semiconductor component and a semiconductor component is provided, wherein the carrier has a laterally extending contact area which is laterally interrupted such that material of the contact area laterally bounds at least one recess. The contact area is at least locally covered by a solder material for electrically bridging the at least one recess by the solder material. The semiconductor component has a connection region and is arranged on the carrier such that the connection region faces the contact area and is connected to the contact area by the solder material. Due to the interruption of the contact area, a distribution of eddy currents induced in the contact area by an alternating magnetic field when the semiconductor component soldered on the carrier is suitably excited may be influenced and, in particular, be detectably disturbed. In particular, a reliable evaluation of the wetting of the contact area can thus be carried out, for example, within the scope of a wafer test, without additional wiring and comparatively little time expenditure. In the case of a semiconductor composite, the costs incurred in checking the individual soldered joints can thus be kept low, so that in particular all soldered joints can be checked. This enables continuous process control in the assembly of the semiconductor component, which in turn contributes to the stability of the manufacturing process.

In at least one embodiment, at least one recess is laterally formed as a circular ring, circular ring portion, or circle around a lateral center point of the contact area.

In at least one embodiment, at least one recess extends laterally in a straight line through the lateral center point of the contact area, such that the contact area is divided by the corresponding recess into two halves that are not connected by material of the contact area.

In at least one embodiment, a plurality of recesses is provided. For example, at least one recess is laterally formed as a circular ring, circular ring portion or circle around a lateral center point of the contact area as well as at least one further recess extends laterally in a straight line through the lateral center point of the contact area, such that the contact area is divided by the corresponding recess into two halves that are not connected by material of the contact area.

In at least one embodiment, the semiconductor component is configured as a light emitting diode.

In at least one embodiment, a ratio between an area covered by material of the contact area and an area laterally bounded by material of the contact area free of material of the contact area is between 1:1 and 100:1, in particular between 2:1 and 30:1, preferably between 5:1 and 10:1.

In at least one embodiment, the contact area is laterally circular or rectangular.

In at least one embodiment, at least one recess is laterally formed as a circle, circular ring or circular ring portion around a lateral center point of the contact area. This particularly impairs a distribution of eddy currents in the contact area when suitably excited by an alternating magnetic field.

In at least one embodiment, a size of the contact area is between $2.5 \cdot 10^{-15}$ m$^2$ and $2.5 \cdot 10^{-9}$ m$^2$, in particular between $2.5 \cdot 10^{-11}$ m$^2$ and $1 \cdot 10^{-10}$ m$^2$.

In at least one embodiment, the contact area is interrupted such that the contact area comprises at least two contact segments which are not connected by material of the contact area. The contact area is covered by the solder material for electrically connecting the at least two contact segments in such a way that the at least two contact segments and the connection region are at a potential during intended operation of the semiconductor component. In other words, at least one recess extends laterally through the contact area in such a way that at least two contact segments which are completely galvanically separated from one another result, which contact segments are electrically connected only by the solder material if the soldered joint is sufficient. The contact segments thus form, in particular, a common contact for operating the semiconductor component. In the course of production, however, it may occur that the solder material provided for electrical connection of the contact segments is only partially applied and the soldered joint is to be classified as insufficient.

In at least one embodiment, at least one recess extends laterally in a straight line through the lateral center point of the contact area, such that the contact area is divided by the corresponding recess into two halves that are not connected by material of the contact area.

According to a fourth embodiment of the invention, in at least one embodiment, at least two contact segments are formed point-symmetrically with respect to the lateral center point of the contact area, wherein at least two contact segments mirrored 180° with respect to each other or at least two contact segments point-symmetrical with respect to each other form a respective contact pair. Thus, for example, at least two contact segments are formed point-symmetrically with respect to the lateral center point of the contact area and form a respective contact pair. For each contact pair, the carrier comprises a current source coupled to a first supply terminal and arranged to impress a predetermined current into a first contact segment of the respective contact pair. The carrier comprises a resistor and a switch for each contact pair, wherein the resistor is coupled to a second supply terminal and is configured to be controllably coupled to a second contact segment of the respective contact pair via the switch.

The first supply terminal may be, for example, a supply voltage connection. The second supply connection is, for example, a ground connection. For example, exactly two contact segments may form a contact pair. Alternatively, a plurality of contact segments adjacent in the radial direction with respect to the center point may form a first contact segment and form a contact pair together with a plurality of contact segments adjacent in the opposite radial direction with respect to the center point, which form a second contact segment that is mirrored or rotated by 180° with respect to the first contact segment, for example with respect to the center point.

By separately providing current to the individual contact pairs and suitably checking whether the current supplied to the first contact segment in each case flows out via the second contact segment in each case, a reliable evaluation of the wetting of the contact area can be carried out with comparatively little wiring and time expenditure after the semiconductor component has been soldered to the carrier, for example within the framework of a so-called "End-of-Line" (EoL) test. In the case of a semiconductor composite, the costs incurred for checking the individual soldered joints can be kept low, so that all soldered joints in particular can be checked. This enables continuous process control in the assembly of the semiconductor component, which in turn contributes to the stability of the manufacturing process.

In at least one embodiment, the contact area comprises between one and three contact pairs, in particular exactly two contact pairs.

According to a fifth embodiment of the invention, a method of inspecting a soldered joint is provided. In the method, a system is provided. A primary alternating magnetic field is generated obliquely to the contact area for inducing an eddy electric current in the contact area and the solder material. A secondary field characteristic is determined that is representative of a secondary alternating field induced by the eddy electric current. Depending on the secondary field characteristic, it is checked whether the contact area is covered at least in places by a solder material such that the at least one recess is electrically bridged by the solder material.

In at least one embodiment, a system comprises a semiconductor component and a carrier. For example, one of the semiconductor component and the carrier has a laterally extending contact area and the other of the semiconductor component and the carrier has a laterally extending connection region. The contact area is laterally interrupted such that material of the contact area laterally bounds at least one recess. The contact area is covered, at least in places, by a solder material for electrically bridging the at least one recess by the solder material. The semiconductor component is arranged on the carrier in such a way that the connection region faces the contact area and is connected to the contact area by the solder material.

In at least one embodiment, an excitation coil is provided by means of which the primary alternating magnetic field is generated. An impedance of the excitation coil is sensed. Depending on the impedance of the excitation coil, the secondary field characteristic is determined. In particular, an amplitude of the current flowing through the excitation coil and/or a phase offset between a voltage applied to the excitation coil and the current flowing through the excitation coil can be detected in this context.

In at least one embodiment, a receiver coil is provided by means of which the induced secondary alternating field is detected. Depending on the detected secondary alternating field, the secondary field parameter is determined.

In at least one embodiment, in case the secondary field characteristic exceeds a predetermined threshold value, the soldered joint between the carrier and the semiconductor component is classified as sufficient. Otherwise, the soldered joint is classified as insufficient. In particular, the soldered joint is classified as sufficient if the secondary field characteristic is representative of a comparatively strong secondary alternating field, for example at a high detected impedance. In contrast, if the secondary field characteristic is representative of a comparatively weak secondary alternating field, the soldered joint may be classified as insufficient.

According to a sixth embodiment of the invention, a method of inspecting a soldered joint is provided. In the method, a system is provided. Sequentially per contact pair is:
  the current source is placed in a switched-on state in which a predetermined current is impressed in a first contact segment of the respective contact pair, the respective current source of other contact pairs being placed in a switched-off state.
  the switch is placed in a coupling state in which the second supply terminal is coupled to a second contact segment of the respective contact pair via the resistor, the respective switch of other contact pairs being placed in a decoupling state in each case.
  a voltage characteristic is determined which is representative of a voltage applied to the first and/or second contact segment of the respective contact pair.
  depending on the voltage characteristic value, it is checked whether the contact area is covered at least in places by solder material in such a way that the two contact segments of the respective contact pair are electrically bridged by the solder material. In particular, the respective current source is not set to the switched-on state until all current sources of the other contact pairs are in the switched-off state. In the switched-off state, no current is impressed into the respective contact segment. In particular, the respective switch is not placed in the coupled state until all switches of the other contact pairs are in the uncoupled state. In the decoupling state, the second supply terminal is decoupled from the respective second contact segment. In particular, the voltage characteristic is not determined until all current sources and switches are in a predetermined state and a stable voltage has been established at the respective first and/or second contact segment.

In at least one embodiment, a memory unit is provided comprising a predetermined logical memory value. For each contact pair, depending on the voltage characteristic value, a logical value is determined which is representative of the fact that the two contact segments of the respective contact pair are electrically bridged by the solder material. For each contact pair, the logical value is logically combined with the memory value and the result is written to the memory unit as a new memory value. Depending on the memory value, it is checked whether the two contact segments of each contact pair are electrically bridged by the solder material. In particular, the predetermined logical memory value is logically "1". In this case, the logic operation is performed by a logic "AND". The memory unit may in particular be a flip-flop. By means of the linkage, in particular a reliable evaluation of the wetting of the contact area can be carried out with comparatively low wiring and time expenditure, for example within the scope of a self-test within an EoL test. In this context, a high-precision resistance measurement outside the semiconductor component can be dispensed with.

According to a seventh embodiment of the invention, a headlight for a motor vehicle is disclosed. In particular, the headlight may be a front, or rear, light of the motor vehicle.

BRIEF DESCRIPTION OF THE DRAWINGS

Further advantages, advantageous embodiments and further embodiments result from the embodiment examples described below in connection with the figures.

FIGS. 2a and 2b show embodiments of the contact area of the support according to FIG. 1a;

FIGS. 8a and 8b show a second embodiment example of the contact area of the support according to FIG. 2a;

Elements that are identical, similar or have the same effect are given the same reference signs in the figures. The figures and the proportions of the elements shown in the figures are not to be regarded as to scale. Rather, individual elements may be shown exaggeratedly large for better representability and/or for better comprehensibility. Dashed outlines indicate a functional unit of the elements arranged therein.

DETAILED DESCRIPTION OF ILLUSTRATIVE EMBODIMENTS

A solder connection between a semiconductor component and a carrier, such as an IC, on which the semiconductor component is mounted for contacting, can be checked by an optical method, for example by irradiation with UV or X-ray radiation and determination of a contrast within the contact point as an indication of the quality of the solder connection. However, such a method requires a relatively high expenditure of time; in the case that the contact point is surrounded by metal, only a low contrast can be measured, which limits the reliability of the quality assessment.

Figure 1A:
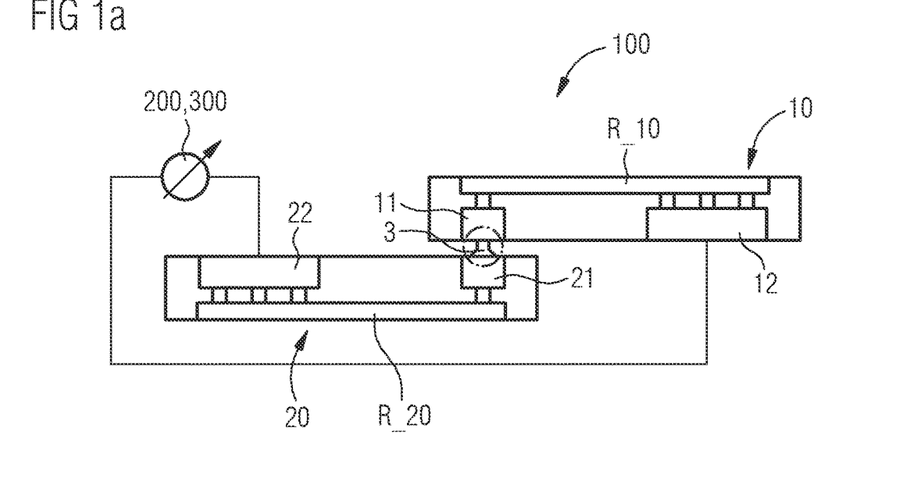
FIGS. 1a and 1b show an arrangement for checking a soldered joint and equivalent circuit diagram.
Figure 1B:
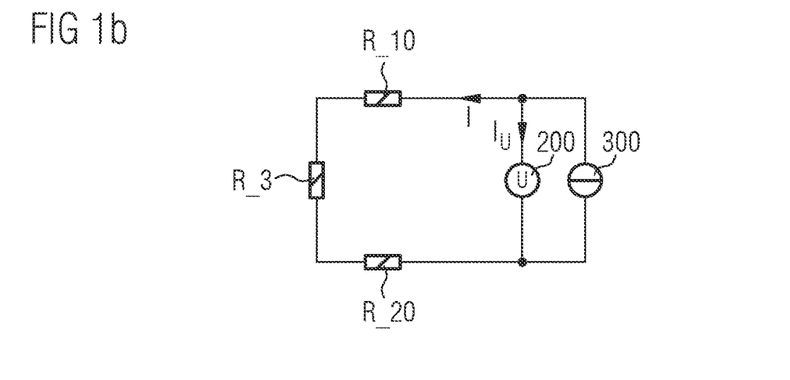

Alternatively, an electrical method can be used to check the soldered joint, for example a Kelvin or four-wire measurement. FIG. 1a shows an arrangement for inspecting a soldered joint. The arrangement comprises a system boo, the system 100 having a semiconductor component 10 with a connection region 11 as anode contact and a further terminal 12 as cathode contact, and a carrier 20 with a contact area 21 and a further contact 22. The semiconductor component 10 is, for example, a light-emitting diode, which may be present individually or in a composite, for example in the form of an LED array. The carrier is, for example, an integrated circuit, in particular a silicon IC. The semiconductor component 10 is arranged on the carrier such that the connection region 11 faces the contact area 21. Via a solder material 3, the connection region 11 is electrically coupled and mechanically connected to the contact area 21. The further terminal 12 and further contact 22 are coupled to a voltmeter 200 and a current source 300. As shown in the equivalent circuit diagram of FIG. 1b, the solder material 3 is thereby associated with a resistor R_3, the semiconductor component 10 is associated with a resistor R_10, and the carrier is associated with a resistor R_20, which together form a series resistor. A voltage dropping across the series resistor when a predetermined current I is impressed by the current source 300 is detected by the voltmeter 200 (current IU<<I) when measured at a high resistance. In particular, the current and voltage at the further terminal 12 and the further contact 22 may be measured to draw conclusions about the series resistance. The series resistance can then be used as an evaluation criterion of the solder connection. However, in contrast to the optical method, the additional test leads require increased wiring, which can lead to space problems, for example in the case of a matrix arrangement of several semiconductor components next to each other, in particular with progressive reduction of the pixel size in the case of an LED array. In particular, when assembling an LED array on an IC at the resolution of, for example, 320×80 pixels, a single anode contact may have a diameter in the range of 10 μm or less, while a cathode contact may be full-area and thus less vulnerable. Moreover, an increase in series resistance may not only be due to an inadequate soldered joint, but may also be due to epitaxy or metallization, which cannot be clearly determined by measuring the series resistance, thereby limiting the reliability of the quality assessment. Finally, the described method is only applicable to test structures with a low-resistance path. Since the solder connection is a particularly critical point in the production of active matrix LEDs, it is necessary to check the quality of the connection of the two solder partners non-destructively and for each chip at wafer level in the course of production.

Figure 2A:
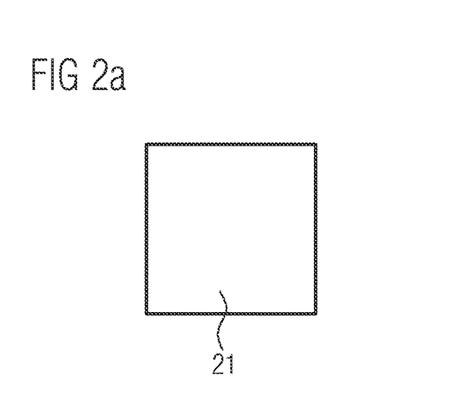
Figure 2B:
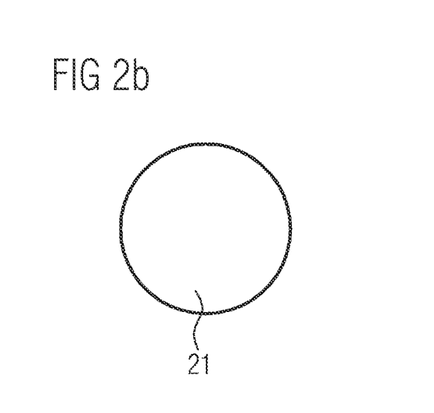

With reference to FIGS. 2a and 2b, respectively, an embodiment variant of the contact area 21 of the carrier 20 according to FIG. 1a is illustrated. The contact area 21 may also be referred to as a solder pad and comprises a continuous conductive surface which is, for example, rectangular (FIG. 2a) or round (FIG. 2b).

In the following, a subdivision of the solder pad on the side of the IC into segments and/or sections or areas is proposed, which is subsequently to be cancelled out by the solder material 3, in order to be able to distinguish a full-surface wetting of the contact area 21 from an only partial wetting in the assembled state of the LED.

Figure 3A:
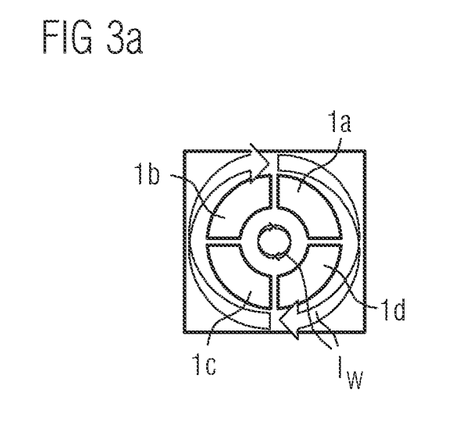
FIGS. 3a and 3b show embodiments of the contact area according to FIGS. 2a and 2b.
Figure 3B:
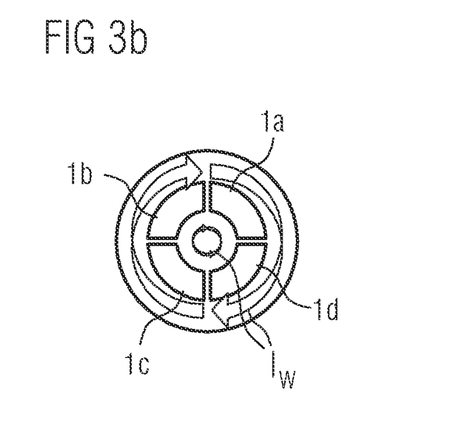

According to a first embodiment example, FIGS. 3a and 3b each show an embodiment variant of the contact area 21 of the carrier 20 in which a plurality of recesses 1a, 1b, 1c and 1d are formed. In these embodiments, the recesses 1a-1d each have a circular ring section shape and are arranged point-symmetrically around a center point of the contact area 21 and are separated from each other by ridges through the center point made of material of the contact area 21. In other embodiments, the recesses 1a-1d may also form a continuous interruption of the contact area and be, for example, circular or annular in shape. In particular, the recess(es) is/are arranged and shaped such that an eddy current $I_W$ in the contact area 21 is impaired. As schematically illustrated with reference to FIGS. 3a, 3b, the contact area 21 is partially slotted in the current direction so that no eddy current is formed in this region. In an assembled state of the semiconductor component 10, that is, when the semiconductor component 10 is arranged on the carrier 20 and electrically and mechanically connected thereto by the solder material 3, a distribution of the solder material 3 on the contact area 21 may be subject to fluctuations due to manufacturing.

With reference to FIGS. 4a, 4b and 5a, 5b, a case of essentially full-surface wetting of the contact area 21 by solder material 3 (FIGS. 4a, 4b) and only partial wetting (FIGS. 5a, 5b) is shown for each of the two embodiment variants.

Figure 4A:
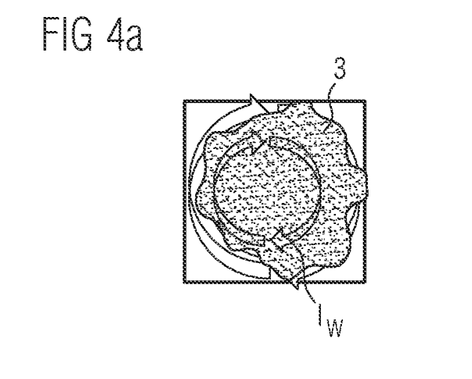
FIGS. 4a and 4b show an example of a full-surface wetting of embodiments of the contact area according to FIGS. 3a and 3b.
Figure 4B:
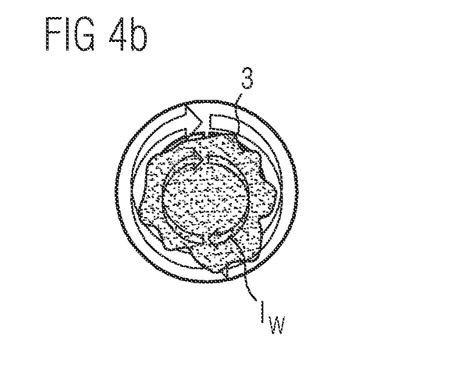
Figure 5A:
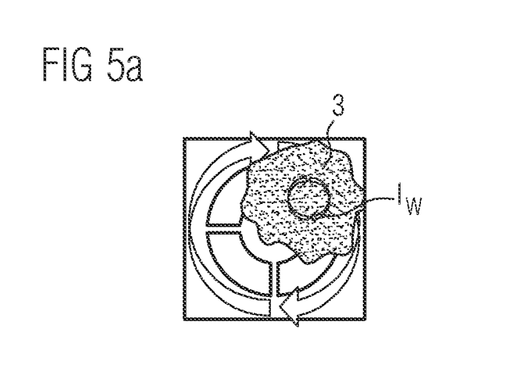
FIGS. 5a and 5b show an exemplary partial wetting of embodiments of the contact area according to FIGS. 3a and 3b.
Figure 5B:
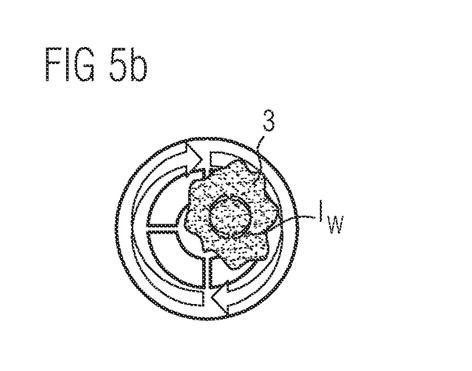

In FIGS. 4a, 4b, the solder material 3 in particular also wets a conductor-free area of the contact area 21 formed by the recesses 1a-1d, so that in conjunction with the solder material 3 a continuous conductor surface is formed in which eddy currents $I_W$ can spread measurably more freely compared to the bare contact area according to FIG. 3a or 3b. In the case of poor or even defective soldered joints, in particular if the solder material 3 only partially wets the recesses 1a-1d (FIGS. 5a, 5b), on the other hand, measurably fewer eddy currents $I_{W\ can\ propagate}$ in the contact area 21 and the solder material 3. The proposed subdivision of the solder pad enables a low-effort and non-destructive evaluation of the wetting of the solder pad of the assembled component in the context of a wafer test.

Figure 6:
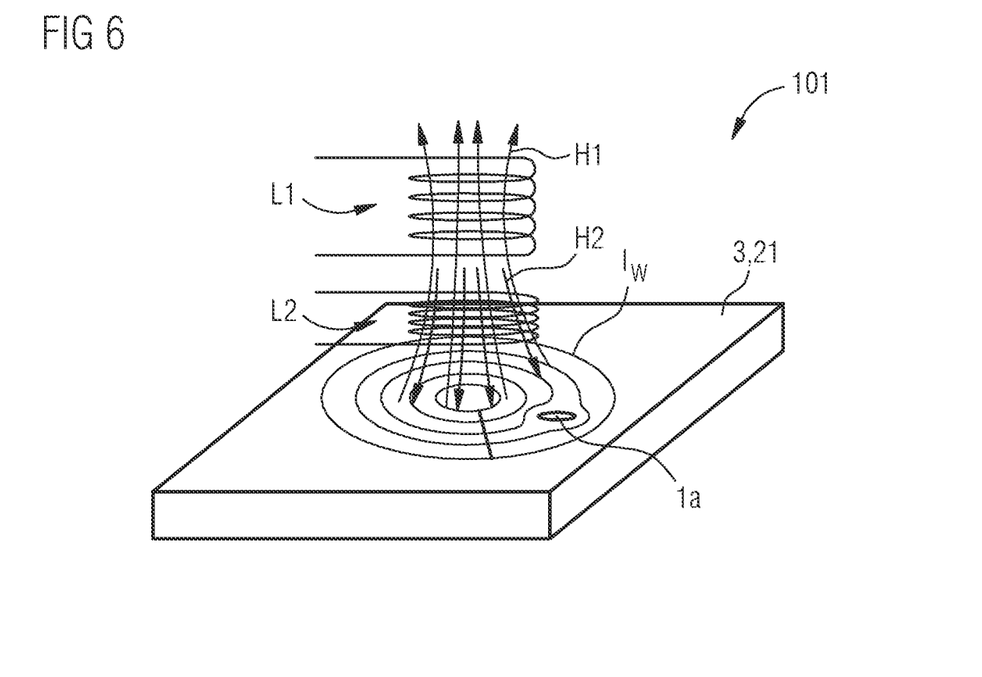
FIG. 6 shows a first embodiment of an arrangement for checking the soldered joint between a semiconductor component and a carrier having a contact area according to FIGS. 3a and 3b.

With reference to FIG. 6, a first embodiment example of an arrangement 101 for checking the soldered joint of a semiconductor component 10 is shown, which is arranged on a carrier 20 with a contact area 21 according to the first embodiment example and is electrically and mechanically connected by the solder material 3. The arrangement 101 comprises an excitation coil L1 for generating a primary alternating magnetic field H1 and, in the embodiment shown, a receiver coil L2 for detecting a secondary alternating magnetic field H2. In other embodiments, instead of the receiver coil L2, the arrangement 101 may also comprise an arrangement for detecting current amplitude, phase offset or impedance during operation of the excitation coil L1.

To check the soldered joint, in a step S11 (FIG. 7), the excitation coil L1 is first arranged with respect to the carrier 20 with the assembled semiconductor component 10 such that its windings are aligned substantially parallel to a main extension plane of the contact area 21.

Figure 7:
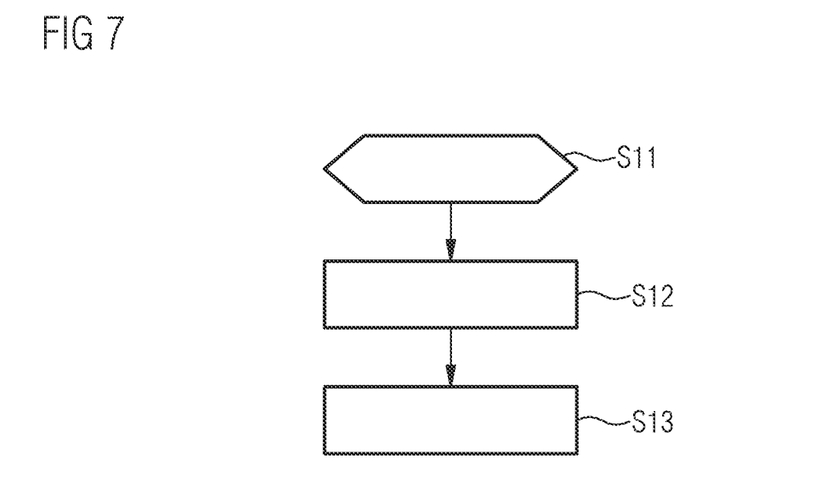
FIG. 7 shows a method for inspecting the soldered joint by the arrangement according to FIG. 6.

Then, in a step S12, the primary alternating magnetic field H1 is generated by applying an alternating voltage to the excitation coil L1 and injecting a medium- to high-frequency alternating current. Due to this primary alternating magnetic field, voltages are induced in electrically conductive materials in accordance with the law of induction, which lead to the formation of an eddy current distribution in the contact area 21 and the solder material 3. The alternating current of the eddy current distribution also generates a secondary alternating magnetic field H2 which counteracts the primary alternating magnetic field H1. A recess 1a in the contact area 21 which is uncovered by the solder material 3 thereby leads to a disturbance of the eddy current distribution.

In a subsequent step S13, the effect of the secondary alternating magnetic field H2 is detected. According to the embodiment variant of FIG. 6, the secondary alternating magnetic field H2 can be detected by the receiver coil L2. In other embodiments, the current amplitude, phase offset or impedance is determined during operation of the excitation coil L1. If the soldering process was successful (FIGS. 4a, 4b), the recesses 1a-1d (FIGS. 3a, 3b) are bridged, allowing a substantially undisturbed eddy current $I_{W\,to}$ flow. In the case of insufficient soldered joints (FIG. 5a, 5b), on the other hand, a significantly smaller area is available which can be penetrated by the primary alternating magnetic field H1. Moreover, an area in which the eddy current $I_W$ can propagate is reduced, so that the secondary alternating magnetic field H2 is significantly weakened in comparison, or a significantly lower impedance of the exciting coil can be measured.

Figure 8A:
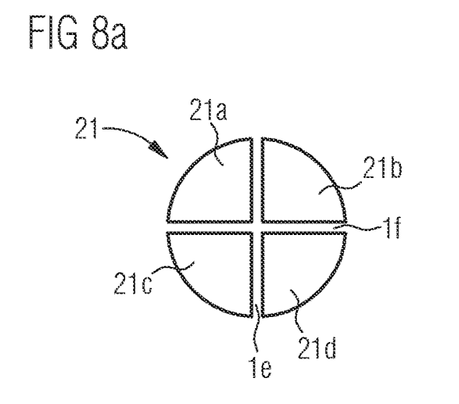

FIG. 8a shows a first embodiment variant of the contact area 2i of the carrier 20 according to a second embodiment example, in which a plurality of recesses 1e, if extending rectilinearly through the center point are formed, which divide the contact area 21 into four contact segments 21a, 21b, 21c and 21d of the same size, which are galvanically separated from one another. In this embodiment, the contact segments 21a-21d each have a circular ring section shape and are arranged point-symmetrically around a center point of the contact area 21.

Figure 8B:
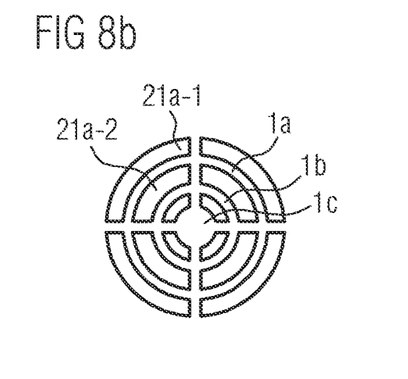

FIG. 8b shows a second embodiment of the contact area 21 of the carrier 20 according to the second embodiment, in which, analogously to the first embodiment (FIGS. 3a, 3b), in addition to the rectilinear recesses 1e, if according to FIG. 8a, circular or annular recesses 1a-1c are formed in the contact area 21, which subdivide the contact segments 21a-21d according to FIG. 8a into further sub-contact segments 21a-1, 21a-2.

Figure 8C:
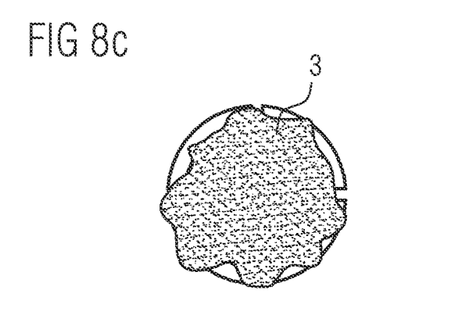
FIG. 8c shows an exemplary full-surface wetting of the contact area of the embodiment of the second embodiment of FIG. 8b.
Figure 8D:
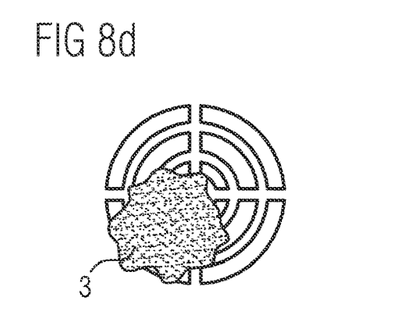
FIG. 8d shows an exemplary partial wetting of the contact area of the embodiment of FIG. 8b.

With reference to FIGS. 8c and 9c, analogous to FIGS. 4a, 4b, and 5a, 5b, a case is shown in each case of essentially full-surface wetting of the contact area 21 by solder material 3 and of only partial wetting.

Figure 9:
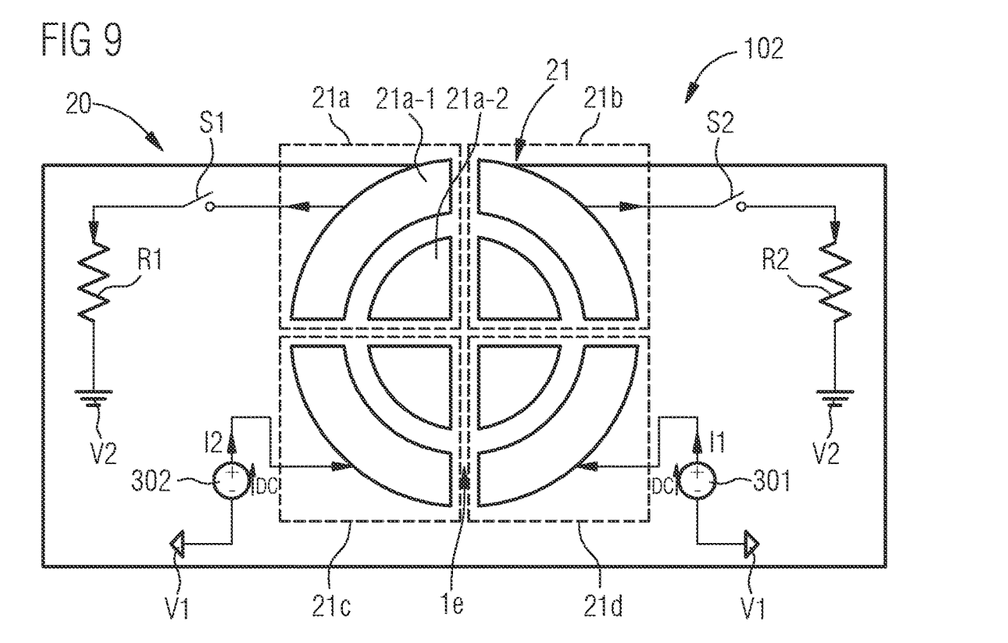
FIG. 9 shows an embodiment of an arrangement for inspecting the soldered joint between a semiconductor component and a carrier having a contact area according to FIGS. 8a and 8b.

In a second embodiment of an arrangement 102 for inspecting the soldered joint of a semiconductor component 10, which is arranged on a carrier 20 having a contact area 21 according to the second embodiment and is electrically and mechanically connected by the solder material 3, the carrier 20 (FIG. 9) comprises a first switch S1, a first resistor R1, a first current source 301, and a supply voltage terminal V1 and a ground terminal V2. A first contact segment 21a of the contact area 21 comprises a first sub-contact segment 21a-1 and a second sub-contact segment 21a-2, which are adjacent in a radial direction with respect to the center point of the contact area 21. A second contact segment 21d is arranged and formed point-symmetrically with respect to the center point of the contact area 21 by 180° with respect to the first contact segment 21a, and forms a contact pair with the first contact segment 21a. Similarly, the contact segments 21b, 21c form a further contact pair. The first contact segment 21a, in particular the outermost sub-contact segment 21a-1 in the radial direction with respect to the center point of the contact area 21, is controllably couplable to the ground terminal V2 via the first switch S1 and the first resistor R1. The second contact segment 21d, in particular the outermost sub-contact segment in the radial direction with respect to the center point of the contact area 21, is controllably coupled to the supply voltage terminal V1 via the first current source 301, which is controllably arranged to inject a predetermined current I1 into the second contact segment 21d. Similarly, the carrier 20 further comprises a second switch S2, a second resistor R2 and a second current source 302 correspondingly coupled to the further contact pair 21b, 21c.

To check the soldered joint, in a step S21 (FIG. 10) first both switches S1, S2 and current sources 301, 302 are actuated in such a way that the contact segments 21a, 21b are disconnected from the ground connection V2 (decoupled state of the switches S1, S2) and no current I1, I2 is impressed in the contact segments 21c, 21d (switched-off state of the current sources 301, 302).

Figure 10:
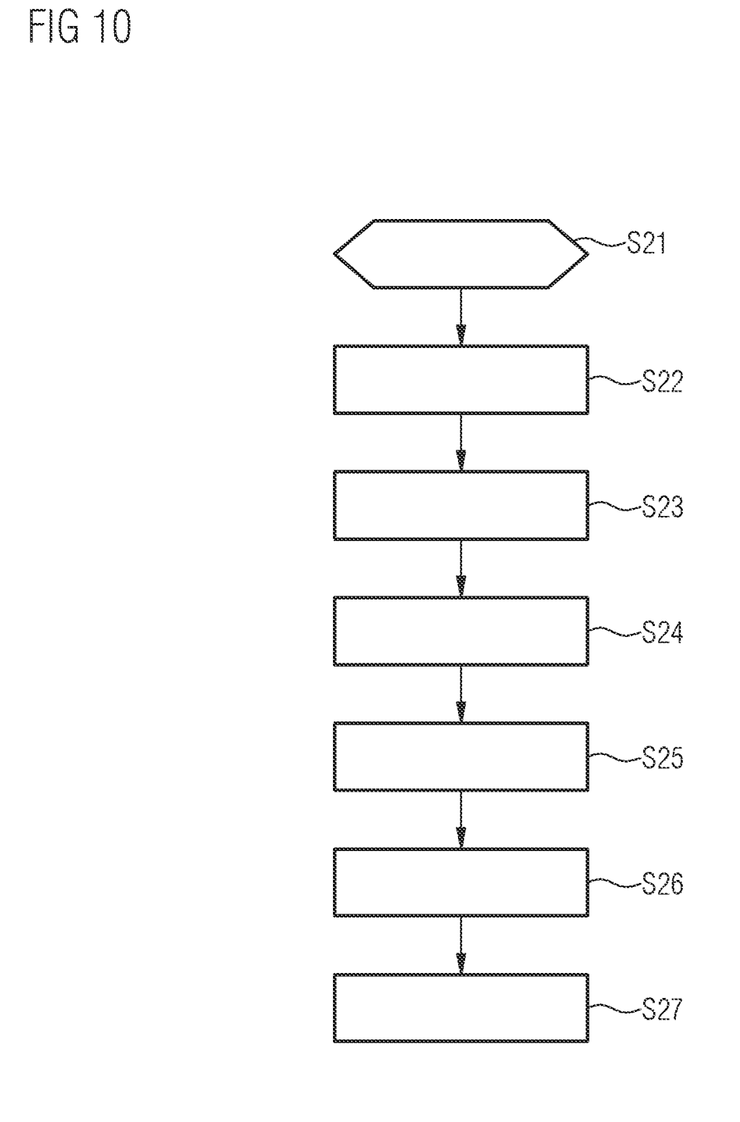
FIG. 10 shows a method for inspecting the soldered joint by the arrangement according to FIG. 9.

Thereafter, in a step S22, the first current source 301 is set to a switched-on state so that the predetermined current I1 is impressed into the second contact segment 21d. Furthermore, the first resistor R1 is connected to the first contact segment 21a by placing the first switch S1 in a coupling state. If the solder material 3 covers the recesses 1a-1f such that the first and second contact segments 21a, 21d are galvanically coupled, ground potential is established at the second contact segment 21d. If, on the other hand, the solder connection is faulty or there is no galvanic connection between the first and second contact segments 21a, 21d, the potential at the second contact segment 21d corresponds to that of the supply voltage connection V1.

In a subsequent step S23, the voltage applied to the second contact segment 21d is determined and, depending on the determined voltage, it is checked whether the contact segments 21a, 21d are galvanically coupled. The result of the check is stored, by way of example, in a memory unit of the carrier 20, such as a flip-flop, which is not shown in greater detail.

Then, in a step S24, the first switch S1 and the first current source 301 are returned to the decoupling or switched-off state.

Thereupon, in a step S25 analogous to the step S22, the second current source 302 is set to the switched-on state and the second switch S2 is set to the coupling state.

Analogously to the step S23, in a subsequent step S26 it is checked whether the contact segments 21b, 21c are galvanically coupled. The result of the check is stored in the memory unit of the carrier 20, by way of example. In particular, for this purpose, in a step S27, a conjunctive operation may be performed with the result stored in step S23, exemplarily by a logical "AND", so that the result stored in the memory unit is representative of whether the corresponding contact segments 21a-21d of both pairs of contacts are each galvanically coupled. In the context of an EOL test, it is thus possible to verify which formation the solder connection has.

The method according to the second embodiment (FIGS. 9, 10) may be combined with the method according to the first aspect. Preferably, in this aspect, the contact area 21 comprises both rectilinear recesses 1e, if and circular, annular or annular segment-shaped recesses 1a-1d (cf. FIG. 8b.

Alternatively or in addition to the contact area 21 of the carrier 20, the connection region 11 may also comprise recesses 1a-1f. In this case, an inspection of the soldered joint can be carried out analogously by way of example using the method according to the first embodiment example.

The invention is not limited to the embodiments by the description based thereon. Rather, the invention encompasses any new feature as well as any combination of features, which in particular includes any combination of features in the patent claims, even if this feature or combination itself is not explicitly stated in the patent claims or embodiments.

The invention claimed is:

1. A method for checking a soldered joint, the method comprising:
    providing a system, the system comprising:
        a carrier; and
        a semiconductor component comprising:
            a laterally extending contact area laterally interrupted such that material of the contact area laterally delimits at least two recesses, the contact area configured to be at a potential;
            at least one first recess formed laterally as a circular ring around a lateral center point of the contact area; and
            at least one second recess extends laterally in a straight line through the lateral center point of the contact area so that the contact area is divided by the at least one second recess into two halves, which are not connected by material of the contact area,
    wherein the contact area is interrupted such that the contact area has at least two contact segments which are not connected by the material of the contact area,
    wherein the at least two contact segments are formed point-symmetrically with respect to the lateral center point of the contact area and form a respective contact pair,
    wherein the carrier has a laterally extending connection region,
    wherein the carrier comprises per the respective contact pair:
        a current source coupled to a first supply terminal and configured to inject a predetermined current into a first contact segment of the respective contact pair, and
        a resistor and a switch, the resistor being coupled to a second supply terminal and being configured to be controllably coupled to a second contact segment of the respective contact pair via the switch,
    wherein the contact area is covered at least in parts by a solder material for electrically bridging the at least two recesses by the solder material,
    wherein the contact area is covered by the solder material in such that the at least two contact segments and the connection region are configured to be at the potential, and
    wherein the semiconductor component is arranged on the carrier in-seeh-a-way such that the contact area faces the connection region and is connected to the connection region by the solder material; and
    sequentially per the respective contact pair:
        setting the current source to a switched-on state in which the predetermined current is impressed in the first contact segment of the respective contact pair, a respective current source of other contact pairs being set to a switched-off state;
        setting the switch to a coupling state in which the second supply terminal is coupled to the second contact segment of the respective contact pair via the resistor, a respective switch of other contact pairs each being set to a decoupling state,
        determining a voltage characteristic value which is representative of a voltage applied to the first contact segment and/or the second contact segment of the respective contact pair; and
        checking, depending on the voltage characteristic value, whether the contact area is covered at least in parts by the solder material in such that the two contact segments of the respective contact pair are electrically bridged by the solder material.

2. The method according to claim 1, wherein the semiconductor component is a light-emitting diode.

3. The method according to claim 1, wherein a ratio between an area covered by the material of the contact area and an area laterally delimited by the material of the contact area and free of the material of the contact area is between 1:1 and 100:1.

4. The method according to claim 1, wherein the contact area is laterally circular or rectangular.

5. The method according to claim 1, wherein at least one third recess is laterally formed as a circle or circular ring portion around the lateral center point of the contact area.

6. The method according to claim 1, wherein a size of the contact area is between $2.5 \cdot 10^{-15}$ m$^2$ and $2.5 \cdot 10^{-9}$ m$^2$.

7. The method according to claim 1,
    wherein a memory is provided comprising a predetermined logical memory value,
    wherein a logic value is determined for each contact pair as a function of the voltage characteristic value, which logic value is representative of the two contact segments of the respective contact pair being electrically bridged by the solder material,
    wherein, for each contact pair, the logical value is logically linked to the memory value and a result is written to the memory as a new memory value, and
    wherein, depending on the memory value, it is checked whether the two contact segments of each contact pair are electrically bridged by the solder material.

8. A method for checking a soldered joint, the method comprising:
    providing a system comprising a semiconductor component and a carrier, wherein one of the semiconductor component or the carrier has a laterally extending contact area and the other of the semiconductor component or the carrier has a laterally extending connection region, wherein the contact area is laterally interrupted in such a way that material of the contact area laterally delimits at least one recess, wherein the contact area is covered at least in pails by a solder material for electrically bridging the at least one recess by the solder material, wherein the semiconductor component is arranged on the carrier such that the connection region faces the contact area and is connected to the contact area by the solder material;
    generating a primary alternating magnetic field obliquely to the contact area thereby inducing an eddy electric current in the contact area and the solder material;
    determining a secondary field characteristic value representative of a secondary alternating magnetic field induced by the eddy current; and
    checking, depending on the secondary field characteristic value, whether the contact area is covered at least in parts by the solder material such that the at least one recess is electrically bridged by the solder material.

9. The method according to claim 8,
wherein the contact area is interrupted such that the contact area has at least two contact segments which are not connected by material of the contact area, and
wherein the contact area is covered by the solder material such that the at least two contact segments and the connection region are configured to be at a potential.

10. The method according to claim 9,
wherein the at least two contact segments are formed point-symmetrically with respect to the lateral center point of the contact area and form a respective contact pair, and
wherein the carrier comprises per respective contact pair:
a current source coupled to a first supply terminal and configured to inject a predetermined current into a first contact segment of the respective contact pair, and
a resistor and a switch, the resistor being coupled to a second supply terminal and being configured to be controllably coupled to a second contact segment of the respective contact pair via the switch.

11. The method according to claim 10, wherein the contact area comprises between one and three contact pairs.

12. The method according to claim 8,
wherein the primary alternating magnetic field is generated by an excitation coil,
wherein an impedance of the excitation coil is detected, and
wherein the secondary field characteristic value is determined depending on the impedance of the excitation coil.

13. The method according to claim 8,
wherein the secondary alternating magnetic field is detected by a receive coil, and
wherein the secondary field characteristic value is determined depending on the detected secondary alternating magnetic field.

14. The method according to claim 8, further comprising classifying the soldered joint between the carrier and the semiconductor component as sufficient when the secondary field characteristic value exceeds a predetermined threshold value.

15. The method according to claim 8, wherein the semiconductor component is a light-emitting diode.

16. The method according to claim 8, wherein the contact area is laterally circular or rectangular.

17. The method according to claim 8, wherein at least one third recess is laterally formed as a circle or circular ring portion around the lateral center point of the contact area.

\* \* \* \* \*

UNITED STATES PATENT AND TRADEMARK OFFICE
CERTIFICATE OF CORRECTION

PATENT NO. : 12,044,722 B2  
APPLICATION NO. : 17/612895  
DATED : July 23, 2024  
INVENTOR(S) : Richter et al.

Page 1 of 1

It is certified that error appears in the above-identified patent and that said Letters Patent is hereby corrected as shown below:

In the Claims

In Column 13, in Claim 1, Line 53, delete "such that" and insert -- such a way that --.

In Column 13, in Claim 1, Line 57, after "carrier" delete "in-seeh-a-way".

In Column 14, in Claim 1, Line 10, delete "such that" and insert -- such a way that --.

In Column 14, in Claim 8, Line 52, delete "pails" and insert -- parts --.

Signed and Sealed this  
Twenty-first Day of January, 2025

Coke Morgan Stewart  
*Acting Director of the United States Patent and Trademark Office*